(12) United States Patent
Long et al.

(10) Patent No.: US 10,605,834 B2
(45) Date of Patent: Mar. 31, 2020

(54) CLAMP METER

(71) Applicant: Fluke Corporation, Everett, WA (US)

(72) Inventors: Qiqiang Long, Shanghai (CN);
Zhengping Wu, Shanghai (CN)

(73) Assignee: Fluke Corporation, Everett, WA (US)

( * ) Notice: Subject to any disclaimer, the term of this patent is extended or adjusted under 35 U.S.C. 154(b) by 55 days.

(21) Appl. No.: 15/875,973

(22) Filed: Jan. 19, 2018

(65) Prior Publication Data

US 2018/0210014 A1    Jul. 26, 2018

(30) Foreign Application Priority Data

Jan. 20, 2017    (CN) .................... 2017 2 0070727 U

(51) Int. Cl.
  *G01R 15/18*    (2006.01)
  *G01R 27/20*    (2006.01)
  *G01R 27/18*    (2006.01)
(52) U.S. Cl.
  CPC ........... *G01R 15/186* (2013.01); *G01R 27/18* (2013.01); *G01R 27/20* (2013.01)
(58) Field of Classification Search
  CPC .......... G01R 1/22; G01R 1/04; G01R 15/125; G01R 31/021
  See application file for complete search history.

(56) References Cited

U.S. PATENT DOCUMENTS

| | | |
|---|---|---|
| 4,851,761 A | 7/1989 | Matsuno |
| 2010/0118449 A1 | 5/2010 | Jackson et al. |
| 2010/0283491 A1 | 11/2010 | Zurek et al. |
| 2013/0191059 A1 | 7/2013 | Legros |
| 2014/0233144 A1 | 8/2014 | Seon |
| 2016/0155564 A1* | 6/2016 | Ortiz ..................... H01F 27/362 336/84 C |
| 2017/0023624 A1* | 1/2017 | Gao ..................... G01R 15/125 |

OTHER PUBLICATIONS

European Search Report for Application No. EP 18 15 2628.6 dated Jun. 15, 2018, 9 pages.

* cited by examiner

*Primary Examiner* — Son T Le
*Assistant Examiner* — Adam S Clarke
(74) *Attorney, Agent, or Firm* — Seed Intellectual Property Law Group LLP

(57) ABSTRACT

A clamp meter to be used for detecting resistance of a ground loop on which the detection is to be performed includes a source transformer unit that is configured to receive an alternating input voltage signal and is capable of being electrically coupled to the ground loop on which the detection is to be performed; an induction transformer unit that is capable of being electrically coupled to the ground loop and the induction transformer unit being configured to be capable of generating an induced current signal as a response to the input voltage signal; a reference resistance loop that is electrically coupled to the source transformer unit and the induction transformer unit; and a processing controller that receives the induced current signal and the processing controller is configured to be capable of determining the resistance of the ground loop based on the induced current signal.

21 Claims, 5 Drawing Sheets

CLAMP METER

BACKGROUND

Technical Field

The present application relates to an electronic measurement technology, and in particular, to a clamp meter for detecting resistance of a ground loop.

Description of the Related Art

A clamp meter for detecting resistance of a ground loop, also referred to as a ground clamp meter, is a hand-held instrument that can detect a multi-grounding system without disconnecting the ground loop on which the detection is to be performed. A clamp meter therefore has been widely applied in industrial production and daily life. For example, typical uses of the clamp meter include testing resistance of ground loops for high-voltage towers, buildings, mobile communication base stations, radio frequency transmitters, and so on, as well as performing detecting for lightning protection systems.

BRIEF SUMMARY

One objective of the present application is to provide a clamp meter capable of improving measurement accuracy.

In one aspect, the present application discloses a clamp meter. The clamp meter can be used for detecting resistance of a ground loop on which the detection is to be performed. The clamp meter includes: a source transformer unit, wherein the source transformer unit is configured to receive an alternating input voltage signal and is capable of being electrically coupled to the ground loop on which the detection is to be performed; an induction transformer unit, wherein the induction transformer unit is capable of being electrically coupled to the ground loop on which the detection is to be performed and the induction transformer unit is configured to be capable of generating an induced current signal as a response to the input voltage signal; a reference resistance loop, wherein the reference resistance loop is electrically coupled to the source transformer unit and the induction transformer unit; and a processing controller, wherein the processing controller receives the induced current signal and the processing controller is configured to be capable of determining the resistance of the ground loop on which the detection is to be performed based on the induced current signal.

In the present application, since a reference resistance loop electrically coupled to a source transformer unit and an induction transformer unit of a clamp meter is provided, specific physical parameters of the reference resistance loop can be adjusted to counteract the influence of electromagnetic interference between the source transformer unit and the induction transformer unit on detection results, so as to improve measurement accuracy of the clamp meter.

In some embodiments, the source transformer unit includes a toroidal core for a source transformer and a first coil winding set wound around the toroidal core for the source transformer; and the induction transformer unit includes a toroidal core for an induction transformer and a second coil winding set wound around the toroidal core for the induction transformer.

In some embodiments, the toroidal core for the source transformer and the toroidal core for the induction transformer each includes a first clamp and a second clamp capable of opening and closing relative to each other; wherein when the first clamp closes relative to the second clamp, a closed region is formed between the first clamp and the second clamp; and when the first clamp opens relative to the second clamp, an opening is formed between the first clamp and the second clamp, and a segment of the ground loop on which the detection is to be performed is capable of being placed between the first clamp and the second clamp through the opening.

In some embodiments, the toroidal core for the source transformer is disposed side by side with the toroidal core for the induction transformer in an axial direction, so that the first clamp and the second clamp of the toroidal core for the source transformer open and close synchronously with the corresponding first clamp and second clamp of the toroidal core for the induction transformer unit.

In some embodiments, the reference resistance loop includes a wire and a resistive element connected to each other in series, and the wire passes through the closed region formed by the first clamp and the second clamp of the toroidal core for the source transformer and passes through the closed region formed by the first clamp and the second clamp of the toroidal core for the induction transformer.

In some embodiments, the wire is wound one or more turns around the toroidal core for the source transformer and the toroidal core for the induction transformer.

In some embodiments, a resistance value of the resistive element is between 500 and 1500 ohms.

In some embodiments, the clamp meter further includes: a first shield covering the toroidal core for the source transformer and the first coil winding set; and a second shield covering the toroidal core for the induction transformer and the second coil winding set.

In some embodiments, the clamp meter further includes an induced signal processing unit connected to the second coil winding set, and the induced signal processing unit receives the induced current signal from the induction transformer unit and generates an effective induced voltage corresponding to the induced current signal.

In some embodiments, the induced signal processing unit includes the following that are connected successively: a current/voltage conversion unit, a band-pass filter, an inverting amplifier, and an effective value calculation unit, and the induced signal processing unit is connected to the processing controller through a first analog-digital conversion unit.

In some embodiments, the clamp meter further includes: a reference signal processing unit connected to a resistive element of the reference resistance loop, and the reference signal processing unit receives a reference voltage signal generated by the reference resistance loop as a response to the input voltage signal and generates an effective reference voltage based on the reference voltage signal.

In some embodiments, the reference signal processing unit includes the following that are connected successively: a positive-phase amplifier, a band-pass filter, and an effective value calculation unit, and the reference signal processing unit is connected to the processing controller through a second analog-digital conversion unit.

In some embodiments, the clamp meter further includes: a reference signal processing unit connected to a resistive element of the reference resistance loop, the reference signal processing unit receives a reference voltage signal generated by the reference resistance loop as a response to the input voltage signal and generates an effective reference voltage based on the reference voltage signal; the reference signal processing unit includes the following that are connected successively: a positive-phase amplifier, a band-pass filter, and an effective value calculation unit, and the reference signal processing unit is connected to the processing controller through the first analog-digital conversion unit.

In some embodiments, the clamp meter further includes a signal source, and the signal source is configured to provide the input voltage signal to the source transformer unit.

In some embodiments, the input voltage signal is a voltage signal of a square wave or a sine wave.

In some embodiments, the processing controller further includes a memory, the memory stores a preset standard voltage value, and the processing controller is configured to compare a value of the effective reference voltage with the preset standard voltage value, and determine that the first clamp and the second clamp of the toroidal core for the source transformer and the first clamp and the second clamp of the toroidal core for the induction transformer are not closed properly when a difference between the preset standard voltage value and the value of the effective reference voltage is greater than a predetermined threshold.

In some embodiments, the processing controller further includes a memory, the memory stores a preset standard voltage value, the processing controller is configured to perform a self-test operation upon power-on; and during the self-test operation, the processing controller determines a correction coefficient based on a value of the effective reference voltage and the preset standard voltage value and stores the correction coefficient in the memory for correcting the resistance of the ground loop on which the detection is to be performed and the resistance being measured by the clamp meter.

In some embodiments, the processing controller further includes a memory, the processing controller is configured to perform a self-test operation upon power-on; and during the self-test operation, the processing controller determines an initial induced current value in the induction transformer unit as a response to the input voltage signal and stores the initial induced current value in the memory.

In some embodiments, when the ground loop on which the detection is to be performed is electrically coupled to the source transformer unit and the induction transformer unit, the induction transformer unit generates a detection induced current signal, and the processing controller determines the resistance of the ground loop on which the detection is to be performed based on the initial induced current value and the detection induced current signal.

In some embodiments, the clamp meter further includes a time-sharing controller used for controlling output of the induced signal processing unit and the reference signal processing unit to be inputted to the processing controller respectively through the first analog-digital conversion unit at different times.

The foregoing is a summary of the present application where simplification, generalization, and omitted details may exist. Therefore, it should be appreciated by those skilled in the art that this section is for exemplary illustration only, and not intended to limit the scope of the present application by any means. This summary section is not intended to identify key features or essential features of the claimed subject matter, and is not intended to be used as a supplementary means to identify the scope of the claimed subject matter.

BRIEF DESCRIPTION OF THE SEVERAL VIEWS OF THE DRAWINGS

Those skilled in the art will be able to fully and clearly understand the aforementioned and other features of the present application through detailed description made below with reference to the accompanying drawings and the appended claims. It can be understood that these accompanying drawings and detailed description merely describe several exemplary embodiments of the present application and should not be considered as limitation to the scope of the present application. The present application will be described with more clarity and in more detail with reference to the accompanying drawings.

DETAILED DESCRIPTION

The following detailed description is made with reference to the accompanying drawings that are part of the specification. Unless otherwise specified in the context, similar symbols usually represent similar components in the accompanying drawings. The illustrative embodiments described in the detailed description, the accompanying drawings, and the claims are not meant to be limiting. Other embodiments may be adopted or other modifications may be made without departing from the spirit or scope of the subject matter of the present application. It can be understood that the various aspects of the present application generally described in the present application and graphically presented in the accompanying drawings may be arranged, replaced, combined, and designed in many different configurations, which, undoubtedly, all form part of the present application.

Figure 1:
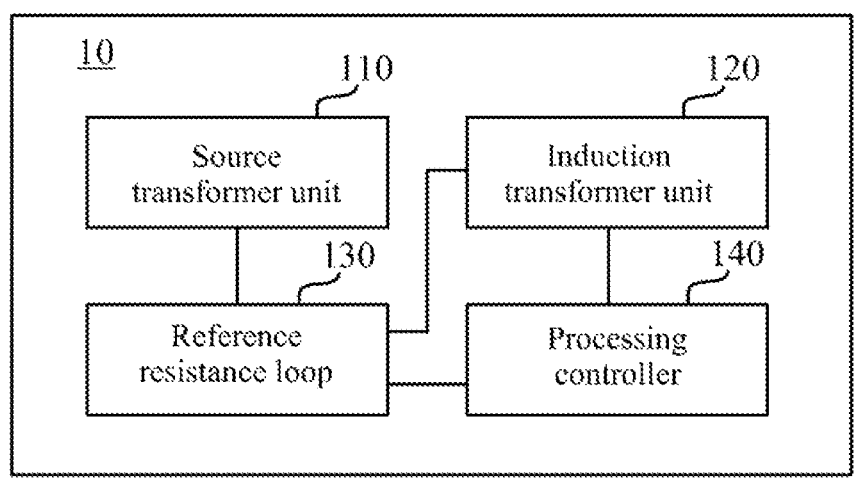
FIG. 1 schematically illustrates, in the form of a block diagram, main measurement components of a clamp meter according to an embodiment of the present application.

Please refer to FIG. 1. FIG. 1 schematically illustrates, in a block diagram, main measurement components of a clamp meter 10 according to an embodiment of the present application. As shown in FIG. 1, the clamp meter 10 includes a source transformer unit 110, an induction transformer unit 120, a reference resistance loop 130, and a processing controller 140.

The source transformer unit 110 is configured to receive an alternating input voltage signal and may be electrically coupled to a ground loop on which the detection is to be performed (not shown). In the case that the source transformer unit 110 is electrically coupled to the ground loop on which the detection is to be performed, the alternating input voltage signal input to the source transformer unit 110 can form an alternating induced voltage having the same frequency on the ground loop on which the detection is to be performed, and then generate an alternating induced current in the ground loop on which the detection is to be performed.

The induction transformer unit 120 may also be electrically coupled to the ground loop on which the detection is to be performed. When the ground loop on which the detection is to be performed is electrically coupled to the induction transformer unit 120, an alternating induced current generated in the ground loop on which the detection is to be performed in response to the input voltage signal can correspondingly generate an induced current as a response to the input voltage signal in the induction transformer unit 120, and the induced current has the same frequency as that of the input voltage signal.

The reference resistance loop 130 is separately and electrically coupled to the source transformer unit 110 and the induction transformer unit 120. The input voltage signal input to the source transformer unit 110 can also generate an alternating induced voltage having the same frequency on the reference resistance loop 130 like the ground loop on which the detection is to be performed, and then generate an induced current on the induction transformer unit 120; and the induced current is superimposed with the induced current generated in the ground loop on which the detection is to be performed to form an induced current signal. Therefore, the induced current signal generated in the induction transformer unit 120 includes the induced current associated with the ground loop on which the detection is to be performed and the induced current associated with the reference resistance loop.

The induced current signal generated in the induction transformer unit 120 is transmitted to the processing controller 140, and the processing controller 140 can determine resistance of the ground loop on which the detection is to be performed based on the induced current signal. A specific determination method will be described in detail below.

Figure 2:
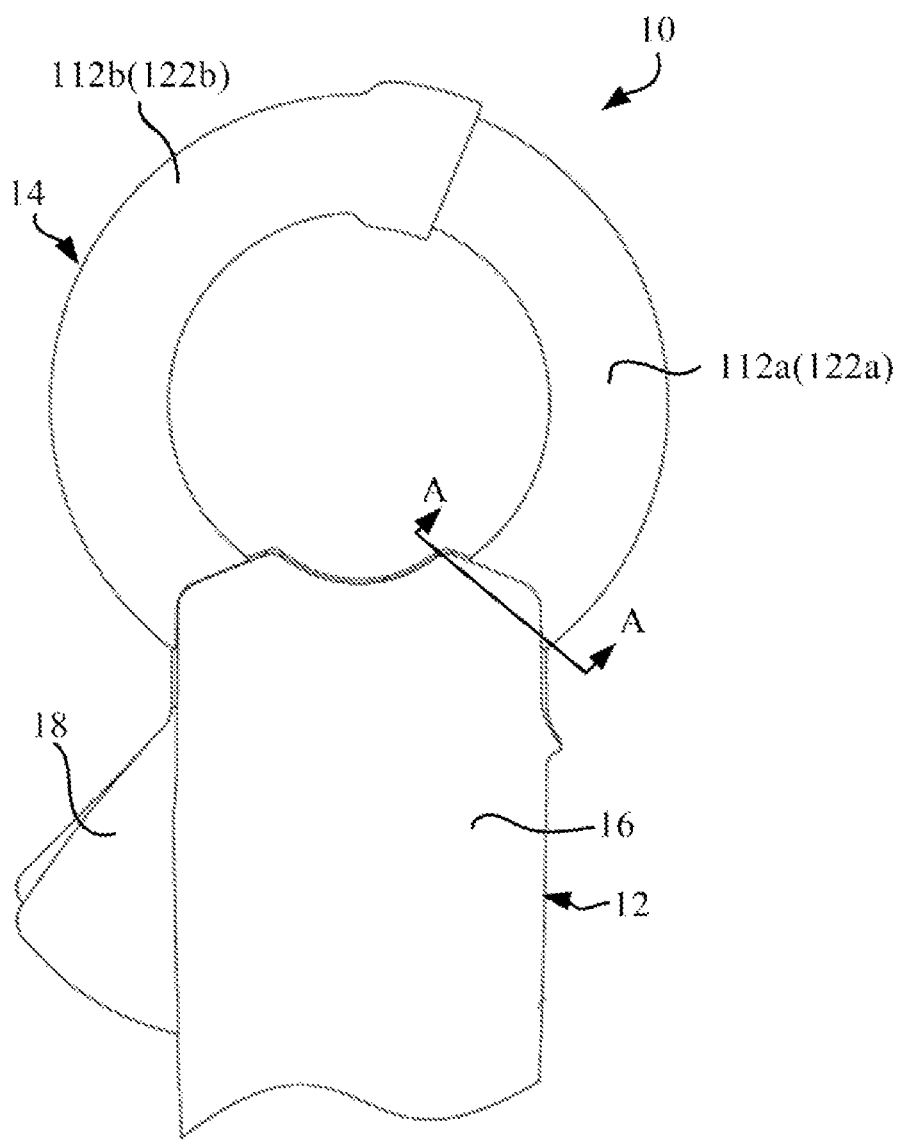
FIG. 2 is a schematic structural view of a clamp meter according to an embodiment of the present application.
Figure 3:
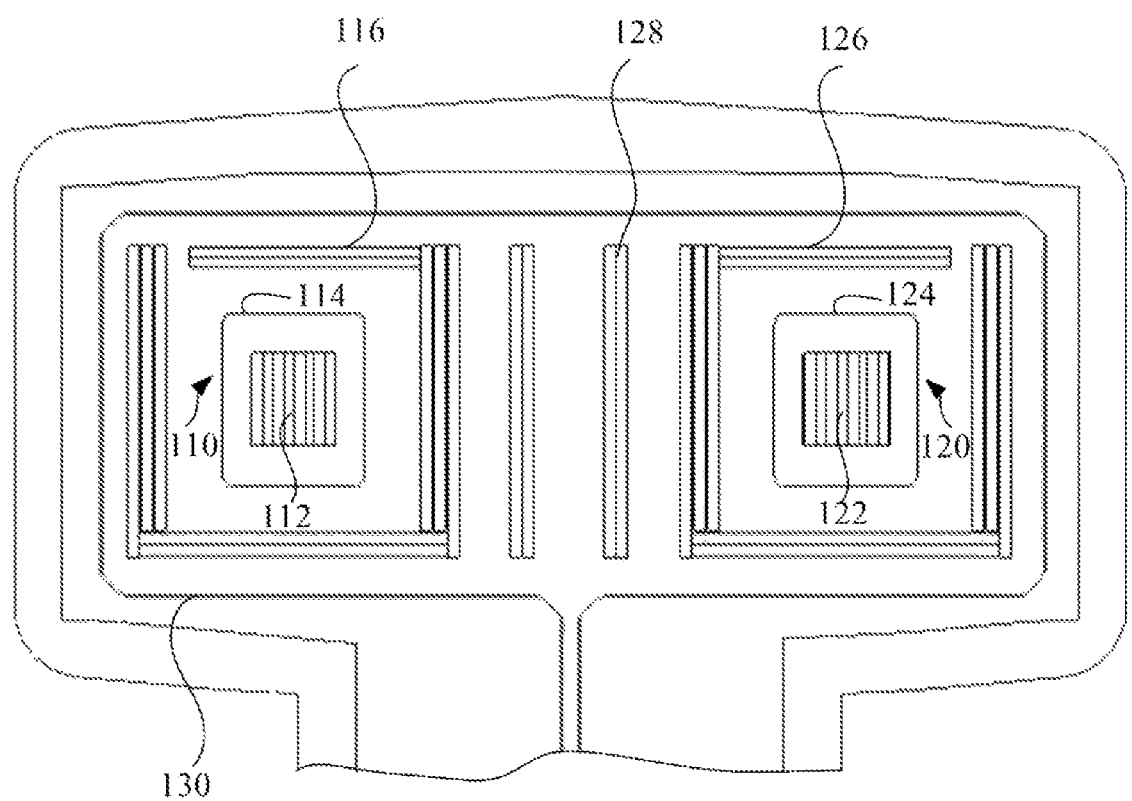
FIG. 3 is a cross-sectional view of the clamp meter shown in FIG. 2 in direction A-A in FIG. 2.
Figure 4:
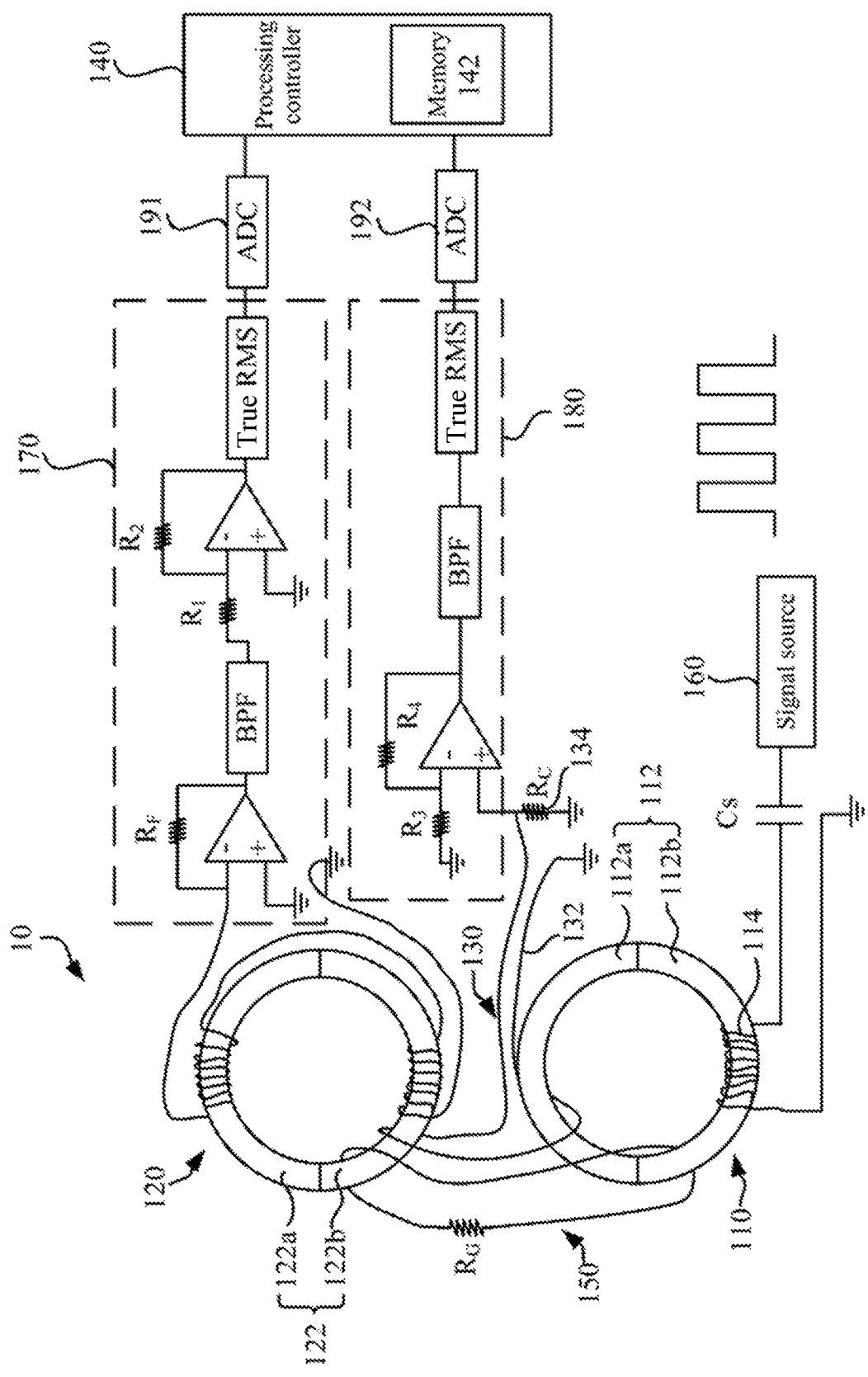
FIG. 4 schematically illustrates a circuit structure of a clamp meter according to an embodiment of the present application.

FIG. 2 to FIG. 4 further illustrate a specific structure of a clamp meter 10 according to an embodiment of the present application. FIG. 2 is a schematic structural view of the clamp meter 10; FIG. 3 is a cross-sectional view of the clamp meter 10 in the direction A-A in FIG. 2; and FIG. 4 schematically illustrates a circuit structure of the clamp meter 10.

As shown in FIG. 2, the clamp meter 10 includes a meter body 12 and a clamp assembly 14, wherein the clamp assembly 14 is mounted on the meter body 12 and extends outwards from one end of the meter body 12. The meter body 12 includes a meter body shell 16 that may be made of a light material (for example, plastic) or made of other suitable materials. The structure of the meter body shell 16 is configured to be suitable for accommodating various electronic elements and mechanical elements, such as measurement and control circuits and processors, of the clamp meter 10. The meter body shell 16 may also be provided with various input and output devices, like a control button, a knob, a switch, or a display screen (not shown), according to needs.

Please refer to FIG. 2 and FIG. 3 at the same time. The clamp assembly 14 of the clamp meter 10 includes a source transformer unit 110 and an induction transformer unit 120. The source transformer unit 110 includes a toroidal core for the source transformer 112 and a first coil winding set 114 wound around the toroidal core for the source transformer 112. Similarly, the induction transformer unit 120 includes a toroidal core for the induction transformer 122 and a second coil winding set 124 wound around the toroidal core for the induction transformer 122.

The toroidal core for the source transformer 112 includes a first clamp 112a and a second clamp 112b capable of opening and closing relative to each other. Similarly, the toroidal core for the induction transformer 122 includes a first clamp 122a and a second clamp 122b capable of opening relative to each other. The toroidal core for the source transformer 112 is disposed side by side with the toroidal core for the induction transformer 122 in an axial direction, so that the first clamp 112a and the second clamp 112b of the toroidal core for the source transformer 112 open and close synchronously with the corresponding first clamp 122a and second clamp 122b of the toroidal core for the induction transformer 122. In the present application, the "axial direction" refers to a direction perpendicular to a plane where the toroidal core for the source transformer 112 and the toroidal core for the induction transformer 122 are located and passing through centers of the toroidal cores 112 and 122, which is the direction perpendicular to the paper in FIG. 2.

When the first clamps 112a and 122a close relative to the second clamps 112b and 122b, roughly circular closed regions are formed between the first clamps 112a and 122a and the second clamps 112b and 122b, as shown in FIG. 2. When the first clamps 112a and 122a open relative to the second clamps 112b and 122b, openings are formed between the first clamps 112a and 122a and the second clamps 112b and 122b; specifically, the openings are formed between free ends of the first clamps 112a and 122a and free ends of the second clamps 112b and 122b, which allows a segment of the ground loop on which the detection is to be performed to be placed between the first clamps 112a and 122a and the second clamps 112b and 122b through the openings, so that the segment of the ground loop on which the detection is to be performed can extend through the closed regions formed by the first clamps 112a and 122a and the second clamps 112b and 122b in the closed state.

It should be noted that due to the restrictions of factors such as the manufacturing process, the free ends of the first clamps 112a and 122a and the second clamps 112b and 122b cannot tightly touch each other without a gap in the closed state; a small gap may exist. The presence of the gap decreases the induced voltage generated on the ground loop on which the detection is to be performed and the reference resistance loop as a response to the input voltage signal. When a difference between the induced voltage generated on the ground loop on which the detection is to be performed and the reference resistance loop and an induced voltage generated in an ideal closed state exceeds a certain value, this means the difference between a measured value of the resistance of the ground loop on which the detection is to be performed and an actual value of the resistance is outside an allowable range; and thus determining whether the clamps close properly before detection helps to improve the accuracy of resistance detection. The method for determining whether the clamps close properly will be introduced in detail below.

As shown in FIG. 2, the clamp meter 10 further includes a handle 18. The handle 18 is mechanically connected to the second clamp 112b of the toroidal core for the source transformer 112 and the second clamp 122b of the toroidal core for the induction transformer 122; and the handle 18 is constructed to be capable of driving the second clamps 112b and 122b to open and close relative to the first clamps 112a and 122a. An operator can operate the handle 18 to cause the second clamps 112b and 122b to open and close relative to their respective first clamps 112a and 122a, thereby a segment of the ground loop on which the detection is to be performed can be placed between the first clamps 112a and 122a and the second clamps 112b and 122b for measuring electrical parameters of the ground loop on which the detection is to be performed.

Please refer to FIG. 3. In some embodiments, the clamp meter 10 further includes a first shield 116 covering the toroidal core for the source transformer 112 and the first coil winding set 114, and a second shield 126 covering the toroidal core for the induction transformer 122 and the second coil winding set 124. The first shield 116 and the second shield 126 can reduce the electromagnetic interference between the source transformer unit 110 and the induction transformer unit 120. The first shield 116 and the second shield 126 may use any suitable magnetic shielding material, such as iron, steel, or a soft magnetic alloy (for example, permalloy).

In some embodiments, the first shield 116 and the second shield 126 may be formed by stacking one or more soft magnetic alloy sheets. In order to further reduce the interference between the source transformer unit 110 and the induction transformer unit 120, in the embodiment shown in FIG. 3, one or more shielding interlayers 128 may be further disposed between the first shield 116 and the second shield 126; and the shielding interlayers 126 may use the same material as that of the first shield 116 and the second shield 126, or may use other suitable materials.

In the embodiment of the present application, the first shield 116 does not completely cover the toroidal core for the source transformer 112 and the first coil winding set, with an opening provided on one side (on the upper left corner of FIG. 3) of the first shield 116, away from the second shield 126. Similarly, an opening is also provided on one side (on the upper right corner of FIG. 3) of the second shield 126, away from the first shield 116. The openings on the first shield 116 and the second shield 126 allow the reference resistance loop 130 and the ground loop on which the detection is to be performed located outside the shields 116 and 126 to be electrically coupled to the source transformer unit 110 and the induction transformer unit 120 that are disposed inside the shields 116 and 126 respectively.

The operating principle of the clamp meter 10 of the present application is further described below with reference to the circuit structural diagram of the clamp meter 10 in FIG. 4.

Please refer to FIG. 4. The clamp meter 10, according to the embodiment of the present application, is used for measuring a resistance value $R_G$ of a ground loop 150 on which the detection is to be performed. The ground loop 150 may be, for example, ground loops for high-voltage towers, buildings, mobile communication base stations, radio frequency transmitters, or lightning protection systems, or may be ground loops formed by other multi-point grounding systems.

In order to perform measurement, an operator first presses the handle 18 on the clamp meter 10, so that the second clamps 112b and 122b open relative to the first clamps 112a and 122a to form openings between them. Then, a segment of a cable of the ground loop 150 is placed between the first clamps 112a and 122a and the second clamps 112b and 122b through the openings between the clamps. Afterwards, the handle 18 is released so that the second clamps 112b and 122b close relative to the first clamps 112a and 122a so as to form closed regions between the first clamps 112a and 122a and the second clamps 112b and 122b, and the segment of the ground loop 150 is located in the closed regions.

As shown in FIG. 4, the clamp meter 10 itself may further include a signal source 160 used for providing an alternating input voltage signal $V_S$ to the source transformer unit 110; and the input voltage signal $V_S$ may be an alternating current voltage signal of a square wave, a sine wave, or other waveforms. In some embodiments, the source transformer unit 110 is electrically coupled to the signal source 160 through a capacitor Cs, where the Cs functions to isolate direct current signals. Nevertheless, those skilled in the art can also use other electronic elements having a similar function to connect the signal source 160 and the source transformer unit 110.

Since a segment of the ground loop 150 is electrically coupled to the source transformer unit 110 through the closed region between the first clamp 112a and the second clamp 112b, when the alternating input voltage signal $V_S$ is applied to the first coil winding set 114 of the source transformer unit 110, an induced voltage $V_G$ having the same frequency and an induced current $I_G$ corresponding thereto are generated on the ground loop 150. The value of the induced voltage $V_G$ may be determined based on the number $N_S$ of turns the first coil winding set 114 of the source transformer unit 110 is wound around the toroidal core 112 and the number $N_G$ of turns the cable of the ground loop 150 is wound around the toroidal core 112 of the source transformer unit 110. $N_G$ and $N_S$ may be set according to specific needs during manufacturing of the clamp meter 10. In the embodiment shown in FIG. 4, the number $N_G$ of turns the cable of the ground loop 150 is wound around the toroidal cores 112 and 122 is 1; and therefore, $V_G = V_S/N_S$. However, in some cases, in order to increase the induced voltage on the ground loop on which the detection is to be performed, the number $N_G$ of turns the cable of the ground loop 150 is wound around the toroidal cores 112 may also be greater than 1; and at this time, $V_G = V_S * N_G/N_S$.

The reference resistance loop 130 includes a wire 132 and a resistive element 134 connected in series to each other; and a resistance value of the resistive element 134 is indicated by $R_C$ in FIG. 4. A segment of wire 132 of the reference resistance loop 130 also passes through the closed regions formed by closing the first clamps 112a and 122a and the second clamps 112b and 122b so as to be electrically coupled to the source transformer unit 110 and the induction transformer unit 120. When the alternating input voltage signal $V_S$ is applied to the first coil winding set 114 of the source transformer unit 110, a reference voltage signal $V_C$ and a corresponding induced current are induced on the resistive element 134 of the reference resistance loop 130. Similarly, the magnitude of the reference voltage signal $V_C$ may also be determined based on the number $N_S$ of turns the first coil winding set 114 is wound around the toroidal core 112 and the number $N_C$ of turns the wire 132 of the reference resistance loop 130 is wound around the toroidal core 112, which will not be described herein again. The number $N_C$ of turns the wire 132 of the reference resistance loop 130 is wound around the toroidal core for the source transformer 112 may be 1 or greater than 1; and the specific value thereof may be determined according to the actual application environment and needs of the clamp meter 10. In the embodiment described in FIG. 4, $N_C$ is 1.

Please still refer to FIG. 4. A segment of the ground loop 150 on which the detection is to be performed and a segment of wire 132 of the reference resistance loop 130 further pass through the closed region formed by closing the first clamp 122a and the second clamp 122b, so that the ground loop 150 and the reference resistance loop 130 are further electrically coupled to the induction transformer unit 120 respectively; and then the induction transformer unit 120 can generate an induced current signal as a response to the input voltage signal $V_S$; and the induced current signal contains a current component associated with the ground loop 150 and a current component associated with the reference resistance loop 130.

The processing controller 140 is configured to receive the induced current signal from the induction transformer unit 120 and determine the resistance value $R_G$ of the ground loop 150 on which the detection is to be performed based on the induced current signal. The processing controller 140 may include, for example, one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic elements.

The resistive element 134 in the reference resistance loop 130 may be specifically configured as a wire-wound resistor, a metal-film resistor, a carbon-film resistor, or a resistor of other materials. The resistance value $R_C$ of the resistive element 134 may be specifically set with reference to one or more of the following factors: the distance between the source transformer unit 110 and the induction transformer unit 120; the shielding performance of the first shield 116 and the second shield 126; and the size of the gap between the first clamps 112a and 122a and the corresponding second clamps 112b and 122b in the closed state. When the distance between the source transformer unit 110 and the induction transformer unit 120 is large, the resistance value $R_C$ of the resistive element 134 can be relatively small. When the shielding performance of the first shield 116 and the second shield 126 is desirable, the resistance value $R_C$ of the resistive element 134 can also be relatively small. When the gap between the first clamps 112a and 122a and the corresponding second clamps 112b and 122b in the closed state is small, the resistance value $R_C$ of the resistive element 134 can also be relatively small. Specifically, in some embodiments, the resistance value $R_C$ of the resistive element 134 may be in the range of 500-1500 ohms.

In some embodiments, as shown in FIG. 4, the clamp meter 10 further includes an induced signal processing unit 170 and a first analog-digital conversion unit 191. The induced signal processing unit 170 receives the induced current signal from the induction transformer unit 120 and generates an effective induced voltage corresponding to the induced current signal; and the first analog-digital conversion unit 191 converts the effective induced voltage into a digital voltage signal and transmits it to the processing controller 140.

In a specific embodiment, as shown in FIG. 4, the induced signal processing unit 170 includes a current-voltage conversion unit, a band-pass filter (BPF), an inverting amplifier, and an effective value (RMS) calculation unit that are connected successively. The effective value calculation unit may be a true effective value (True RMS) calculation unit, and when the ground loop 150 on which the detection is to be performed has a nonlinear load, the true effective value calculation unit enables the processing controller 140 to obtain a more accurate calculation result.

After receiving the digital voltage signal transmitted by the first analog-digital conversion unit 191, the processing controller 140 calculates an induced current signal value of the induction transformer unit 120 according to circuit parameters of the induced signal processing unit 170, and then determines the resistance value $R_G$ of the ground loop 150 based on the induced current signal value.

How the processing controller 140 determines the resistance value $R_G$ of the ground loop 150 on which the detection is to be performed based on the induced current signal value is described below by still referring to FIG. 4.

In an ideal clamp meter, there should be no internal interference between the source transformer unit and the induction transformer unit; and then the resistance value of the ground loop on which the detection is to be performed is: $R_G=V_G/I_G$. However, in actual use, the source transformer unit usually generates internal interference with the induction transformer unit due to short distance therebetween, so that an interfering current $I_{ii}$ is generated in the induction transformer unit; and thus the resistance of the ground loop on which the detection is to be performed cannot be accurately measured.

With regard to this, the reference resistance loop 130 is provided in the clamp meter 10 of the present application. The influence of the aforementioned internal interference on the measurement of the ground loop can then be effectively reduced, and thereby improving the measurement accuracy.

Specifically, when the clamp meter 10 is powered on, the processing controller 140 performs a self-test operation. The processing controller 140 first acquires a static bias $I_D$ on the true effective value calculation unit and the first analog-digital conversion unit 191 as well as the circuit therebetween, where the signal is a direct current bias. Then, the processing controller 140 turns on the signal source 160 to input an alternating input voltage signal $V_S$ to the source transformer unit 110; and the processing controller 140 acquires an initial induced current $I_{AC}$ from the induction transformer unit 120 as a response to the input voltage signal $V_S$. Since the ground loop on which the detection is to be performed has not yet been connected at this time, the initial induced current $I_{AC}$ is actually formed by superimposing the static current $I_D$, the interfering current $I_{ii}$ and a reference induced current $I_C$ generated through the reference resistance loop 130. Since the interfering current $I_{ii}$ and the reference induced current $I_C$ have opposite phases, the initial induced current $I_{AC}$ may also be represented by Equation (1):

$$I_{AC}=I_D+I_C-I_{ii} \quad \text{(Equation 1)}$$

During the self-test operation, the processing controller 140 stores the obtained initial induced current value $I_{AC}$ in a memory 142 of the processing controller 140. The memory 142 may be implemented using any type of volatile or non-volatile storage devices or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk, or an optical disc.

When the ground loop 150 on which the detection is to be performed is measured after the self-test operation ends, a segment of the ground loop 150 is placed in the closed regions formed by the first clamps 112a and 122a and the second clamps 112b and 122b, so as to be separately and electrically coupled to the source transformer unit 110 and the induction transformer unit 120. The alternating input voltage signal $V_S$ is inputted through the signal source 160; the induced voltage $V_G$ is generated on the ground loop 150; the induced voltage $V_C$ is generated on the reference resistance loop 130; and a detection induced current signal $I_{G,now}$ as a response to the input voltage signal $V_S$ is generated in the induction transformer unit 120 under joint action of the ground loop 150 and the reference resistance loop 130. The detection induced current signal $I_{G,now}$ actually contains the following several current components: the static current $I_D$, the interfering current $I_{ii}$, the reference induced current $I_C$, and the to-be-detected induced current $I_G$ that is associated with the ground loop 150 on which the detection is to be performed. In other words, $I_{G,now}=I_G+I_D+I_C-I_{ii}$. As described before, $I_{AC}=I_D+I_C-I_{ii}$, and therefore, $I_{G,now}=I_G+I_{AC}$. In the embodiment shown in FIG. 4, since the number of turns of the ground loop on which the detection is to be performed and the number of turns of the reference resistance loop are both 1, $V_G$ and $V_C$ are equal.

The processing controller 140 acquires an effective value of the induced voltage signal output from the first analog-digital conversion unit 191, and calculates to obtain the detection induced current signal $I_{G,now}$ according to electrical parameters of the induced signal processing circuit 170 and the first analog-digital conversion unit 191. The processing controller 140 calculates to obtain the induced voltage $V_G$ generated on the ground loop 150 on which the detection is to be performed from the input voltage signal $V_S$ according to the turns ratio ($N_G/N_S$) between the ground loop on which the detection is to be performed and the source transformer unit 120, and then calculates to obtain a measured resistance value $R_{G,now}$ of the ground loop 150 using the following Equation (2).

$$R_{G,now}=V_G/(I_{G,now}-I_{AC}) \quad \text{(Equation 2)}$$

It can be seen from the above Equation 1 that $I_{ii}$ has a counteracting effect on the value of $I_{AC}$. $I_{ii}$ will cause $I_{AC}$ to change non-monotonically without the component $I_C$. The non-monotonicity of the initial induced current $I_{AC}$ will then cause the measured resistance value $R_{G,now}$ of the ground loop 150 on which the detection is to be performed to change non-monotonically, resulting in inaccurate $R_{G,now}$. However, in this embodiment, this problem can be solved by setting the resistance value $R_C$ of the resistive element 134 so that the reference induced current $I_C$ is always greater than the interfering current $I_{ii}$. Therefore, by means of the clamp meter 10 according to the embodiment of the present application, the resistance value $R_C$ of the resistive element 134 can be set appropriately so as to reduce the influence of the internal interference between the source transformer unit 110 and the induction transformer unit 120 on the measured value of the resistance of the ground loop 150 on which the detection is to be performed, thereby improving measurement accuracy.

Further, in some embodiments, as shown in FIG. 4, the clamp meter 10 may further include a reference signal processing unit 180 and a second analog-digital conversion unit 192. The reference signal processing unit 180 is connected to the reference resistance loop 130; receives the reference voltage signal $V_C$ generated by the reference resistance loop 130 as a response to the input voltage signal $V_S$; and generates an effective reference voltage based on the reference voltage signal $V_C$. When the number of turns of the ground loop on which the detection is to be performed and the number of turns of the reference resistance loop are both 1, $V_G$ and $V_C$ are equal. The second analog-digital conversion unit 192 converts the effective reference voltage into a digital effective reference voltage signal and transmits it to the processing controller 140. In a specific embodiment, the reference signal processing unit 180 includes a positive-phase amplifier, a band-pass filter, and an effective value calculation unit that are connected successively. The effective value calculation unit may be, for example, a true effective value (True RMS) calculation unit.

The processing controller 140 may judge, based on the digital voltage signal received from the first analog-digital conversion unit 191 and the digital effective reference voltage received from the second analog-digital conversion unit 192, whether the first clamps 112a and 122a and the second clamps 112b and 122b close properly, and perform gain compensation for the measured resistance value $R_{G,now}$ of the ground loop 150 on which the detection is to be performed.

Specifically, in an embodiment, a preset standard voltage value $V_{C,CAL}$ is stored in the memory 142 of the processing controller 140. The preset standard voltage value $V_{C,CAL}$ may be set using an induced voltage value induced on the resistive element 134 in the closed state of the clamps during factory manufacturing and correction, and $V_{C,CAL}$ is stored in the memory 142. In the process that the clamp meter 10 performs power-on self-test or measures the resistance value $R_G$ of the ground loop 150 on which the detection is to be performed, the processing controller 140 compares an effective reference voltage value $V_{C,NOW}$ obtained through the reference signal processing unit 180 with the preset standard voltage value $V_{C,CAL}$.

When the first clamp 112a and the second clamp 112b and/or the first clamp 122a and the second clamp 122b open or close improperly, surfaces of the free ends of the two clamps cannot tightly touch each other, causing the measured effective reference voltage value $V_{C,NOW}$ to decrease. Therefore, when the processing controller 140 judges that a difference between the preset standard voltage value $V_{C,CAL}$ and the effective reference voltage value $V_{C,NOW}$ is greater than a predetermined threshold (for example, greater than 5% of $V_{C,CAL}$), it can be determined that the first clamp 112a and the second clamp 112b and/or the first clamp 122a and the second clamp 122b are not closed properly. At this time, the processing controller 140 may control a corresponding output device to send to a user a visible warning signal (for example, the warning light flashes or the display screen displays a corresponding character or graphic) and/or an audible warning signal (for example, an alarm).

Additionally, the transmission efficiency of the voltage induction between the source transformer unit 110 and the induction transformer unit 120 decreases when the number of times the clamp meter 10 is opened and closed increases. The fact that the clamp meter 10 being opened and closed hundreds of times leads to an inaccurate measured value of the resistance of the ground loop 150 on which the detection is to be performed.

Therefore, in some embodiments, a preset standard voltage value $V_{C,CAL}$ is further stored in the memory 142 of the processing controller 140. The processing controller 140 performs a self-test operation upon power-on; and during the self-test operation, the processing controller 140 determines a correction coefficient based on the preset standard voltage value $V_{C,CAL}$ and the effective reference voltage value $V_{C,NOW}$ obtained from the reference signal processing unit 180, $\alpha=(V_{C,NOW}/V_{C,CAL})$; and the processing controller 140 stores the correction coefficient $\alpha$ in the memory 142. When the resistance of the ground loop 150 on which the detection is to be performed is measured, the current measured value $R_{G,NOW}$ of the resistance of the ground loop 150 is corrected using the correction coefficient $\alpha$ according to Equation (3), so as to obtain a resistance value $R_{G,REAL}$ after the gain compensation.

$$R_{G,REAL}=\alpha^* R_{G,NOW}=(V_{C,NOW}/V_{C,CAL})^* R_{G,NOW} \quad \text{(Equation 3)}$$

By means of the aforementioned correction, the present application minimizing the problem of an inaccurate measured value of the resistance of the ground loop 150 on which the detection is to be performed caused by a decrease in transmission efficiency of the clamp meter 10, and thereby improving the measurement accuracy.

Figure 5:
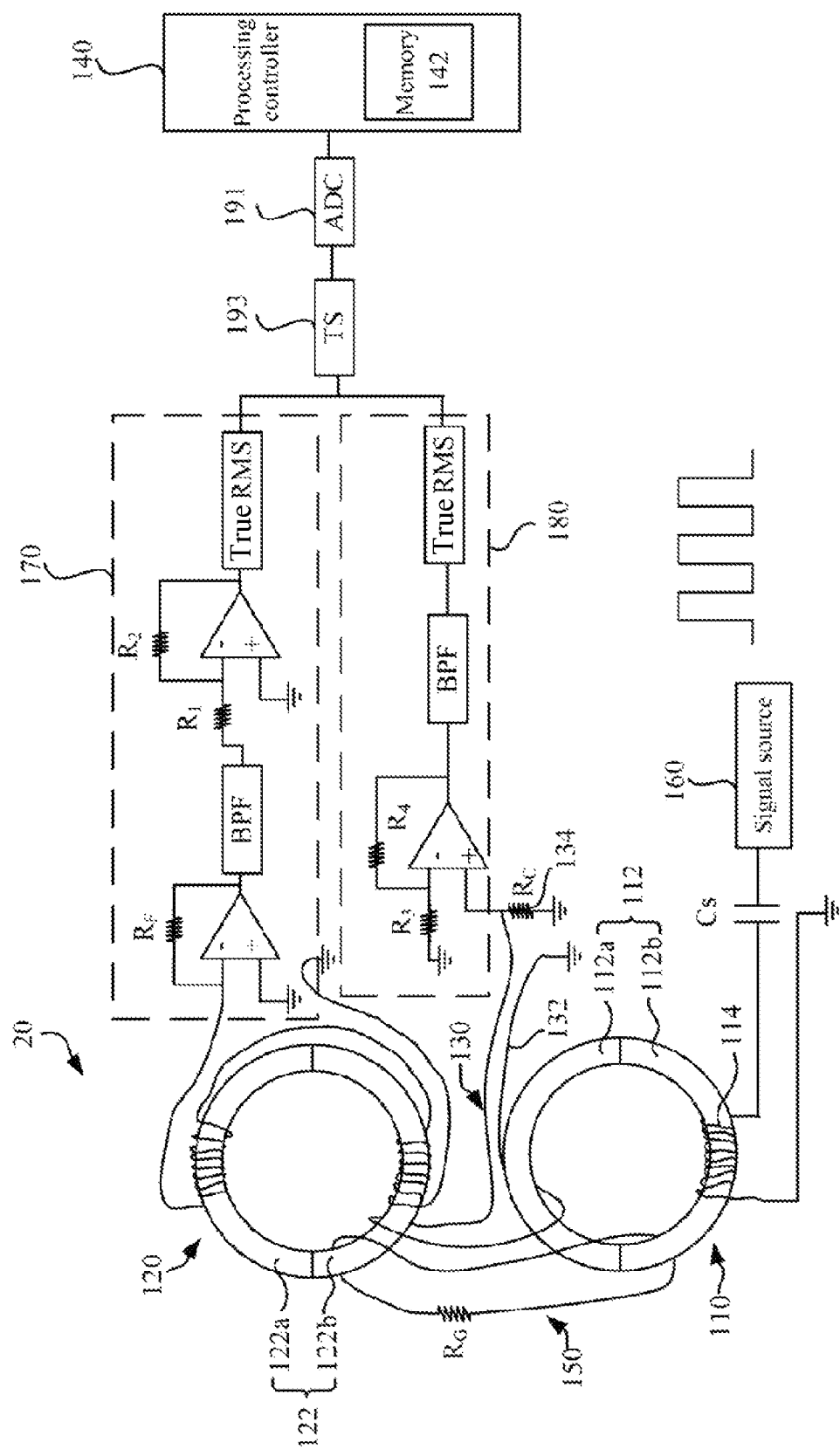
FIG. 5 schematically illustrates a circuit structure of a clamp meter according to another embodiment of the present application.

Please refer to FIG. 5, a circuit structural diagram of a clamp meter 20 according to another embodiment of the present application. The clamp meter 20 mainly differs from the clamp meter 10 shown in in FIG. 4 in that: the clamp meter 20 includes only one analog-digital signal conversion unit 191 and further includes a time-sharing controller 193. The time-sharing controller 193 is separately and electrically coupled to the induced signal processing unit 170 and the reference signal processing unit 180 and is used for controlling inputting the output of the induced signal processing unit 170 and the reference signal processing unit 180 to the processing controller 140 respectively through the analog-digital signal conversion unit 191 at different times. In some embodiments, the time-sharing controller 193 may be implemented using a time-controlled switch.

It should be noted that although several modules or sub-modules of the clamp meter have been mentioned in the above detailed description, such a classification is exemplary and not mandatory. Practically, according to the embodiments of the present application, the features and functions of two or more modules described above may be embodied in one module. Similarly, the feature and function of one module described above may be divided and embodied in multiple modules.

Other variations to the disclosed embodiments can be understood and made by those of ordinary skill in the art from a study of the specification, the disclosed contents, the accompanying drawings, and the appended claims. In the claims, the word "comprise" does not exclude other elements or steps; and the word "a" or "an" does not exclude plurality. In practical application of the present application, one component may perform functions of multiple technical features cited in the claims. Any reference signs in the claims should not be construed as limiting the scope of the present application.

The invention claimed is:

1. A clamp meter, used for detecting resistance of a ground loop on which detection is to be performed, the clamp meter comprising:
   a source transformer, wherein the source transformer comprises a toroidal core and a first coil winding set wound around the toroidal core of the source transformer, and wherein the source transformer is configured to receive an alternating input voltage signal and is electrically coupleable to the ground loop on which detection is to be performed;
   an induction transformer, wherein the induction transformer comprises a toroidal core and a second coil winding set wound around the toroidal core of the induction transformer, and wherein the induction transformer is electrically coupleable to the ground loop on which detection is to be performed and the induction transformer is configured to generate an induced current signal as a response to the input voltage signal;
   a reference resistance loop, wherein the reference resistance loop is electrically coupled to the source transformer and the induction transformer; and
   a processing controller, wherein the processing controller receives the induced current signal and the processing controller is configured to determine the resistance of the ground loop based on the induced current signal,
   wherein the toroidal core of the source transformer and the toroidal core of the induction transformer each comprises a first clamp and a second clamp capable of opening and closing relative to each other, wherein when the first clamp closes relative to the second clamp, a closed region is formed between the first clamp and the second clamp, and when the first clamp opens relative to the second clamp, and opening is formed between the first clamp and the second clamp through which a segment of the ground loop on which the detection is to be performed can pass into the closed region between the first clamp and the second clamp, and
   wherein the clamp meter further comprises a reference signal processor connected to a resistive element of the reference resistance loop, and the reference signal processor receives a reference voltage signal generated by the reference resistance loop as a response to the input voltage signal and generates an effective reference voltage based on the reference voltage signal.

2. The clamp meter according to claim 1, wherein the toroidal core of the source transformer is disposed side by side with the toroidal core of the induction transformer in an axial direction, so that the first clamp and the second clamp of the toroidal core of the source transformer open and close synchronously with the corresponding first clamp and second clamp of the toroidal core of the induction transformer.

3. The clamp meter according to claim 1, wherein the reference resistance loop comprises a wire and a resistive element connected to each other in series, and the wire passes through the closed region formed by the first clamp and the second clamp of the toroidal core of the source transformer and passes through the closed region formed by the first clamp and the second clamp of the toroidal core of the induction transformer.

4. The clamp meter according to claim 3, wherein the wire is wound one or more turns around the toroidal core of the source transformer and the toroidal core of the induction transformer.

5. The clamp meter according to claim 3, wherein a resistance value of the resistive element is 500-1500 ohms.

6. The clamp meter according to claim 1, wherein the clamp meter further comprises:
   a first shield covering the toroidal core of the source transformer and the first coil winding set; and
   a second shield covering the toroidal core of the induction transformer and the second coil winding set.

7. The clamp meter according to claim 1, wherein the clamp meter further comprises an induced signal processor connected to the second coil winding set, and the induced signal processor receives the induced current signal from the induction transformer and generates an effective induced voltage corresponding to the induced current signal.

8. The clamp meter according to claim 7, wherein the induced signal processor comprises the following being connected successively: a current/voltage convertor, a band-pass filter, an inverting amplifier, and an effective value calculator, and the induced signal processor is connected to the processing controller through a first analog-digital converter.

9. The clamp meter according to claim 8, wherein:
   the clamp meter further comprises a reference signal processor connected to a resistive element of the reference resistance loop,
   the reference signal processor receives a reference voltage signal generated by the reference resistance loop as a response to the input voltage signal and generates an effective reference voltage based on the reference voltage signal,
   the reference signal processor comprises the following being connected successively: a positive-phase amplifier, a band-pass filter, and an effective value calculator, and
   the reference signal processer is connected to the processing controller through the first analog-digital convertor.

10. The clamp meter according to claim 9, wherein the clamp meter further comprises a time-sharing controller used for controlling output of the induced signal processor and the reference signal processor to be inputted to the processing controller respectively through the first analog-digital converter at different times.

11. The clamp meter according to claim 1, wherein the reference signal processor comprises the following being connected successively: a positive-phase amplifier, a band-pass filter, and an effective value calculator, and the reference signal processor is connected to the processing controller through a second analog-digital converter.

12. The clamp meter according to claim 1, wherein the clamp meter further comprises a signal source, and the signal source is configured to provide the input voltage signal to the source transformer.

13. The clamp meter according to claim 12, wherein the input voltage signal is a voltage signal of a square wave or a sine wave.

14. The clamp meter according to claim 1, wherein the processing controller further comprises a memory, the memory stores a preset standard voltage value, and the processing controller is configured to compare a value of the effective reference voltage with the preset standard voltage value, and determine that the first clamp and the second clamp of the toroidal core of the source transformer and the first clamp and the second clamp of the toroidal core of the induction transformer are not closed properly when a difference between the preset standard voltage value and the value of the effective reference voltage is greater than a predetermined threshold.

15. The clamp meter according to claim 1, wherein the processing controller further comprises a memory, the memory stores a preset standard voltage value, and the processing controller is configured to perform a self-test operation upon power-on, and during the self-test operation, the processing controller determines a correction coefficient based on a value of the effective reference voltage and the preset standard voltage value and stores the correction coefficient in the memory for correcting the resistance of the ground loop on which detection is to be performed and the resistance being measured by the clamp meter.

16. The clamp meter according to claim 1, wherein the processing controller further comprises a memory, the processing controller is configured to perform a self-test operation upon power-on, and during the self-test operation, the processing controller determines an initial induced current value in the induction transformer as a response to the input voltage signal and stores the initial induced current value in the memory.

17. The clamp meter according to claim 16, wherein when the ground loop on which the detection is to be performed is electrically coupled to the source transformer and the induction transformer, the induction transformer generates a detection induced current signal, and the processing controller determines the resistance of the ground loop on which the detection is to be performed based on the initial induced current value and the detection induced current signal.

18. A clamp meter, used for detecting resistance of a ground loop on which detection is to be performed, the clamp meter comprising:
a source transformer, wherein the source transformer comprises a toroidal core and a first coil winding set wound around the toroidal core of the source transformer, and wherein the source transformer is configured to receive an alternating input voltage signal and is electrically coupleable to the ground loop on which detection is to be performed;
an induction transformer, wherein the induction transformer comprises a toroidal core and a second coil winding set wound around the toroidal core of the induction transformer, and wherein the induction transformer is electrically coupleable to the ground loop on which detection is to be performed and the induction transformer is configured to generate an induced current signal as a response to the input voltage signal;
a reference resistance loop, wherein the reference resistance loop is electrically coupled to the source transformer and the induction transformer; and
a processing controller, wherein the processing controller receives the induced current signal and the processing controller is configured to determine the resistance of the ground loop based on the induced current signal,
wherein the clamp meter further comprises an induced signal processor connected to the second coil winding set, and the induced signal processor receives the induced current signal from the induction transformer and generates an effective induced voltage corresponding to the induced current signal, and
wherein the induced signal processor comprises the following being connected successively: a current/voltage converter, a band-pass filter, an inverting amplifier, and an effective value calculator, and the induced signal processor is connected to the processing controller through a first analog-digital converter.

19. The clamp meter according to claim 18, wherein:
the clamp meter further comprises a reference signal processor connected to a resistive element of the reference resistance loop,
the reference signal processor receives a reference voltage signal generated by the reference resistance loop as a response to the input voltage signal and generates an effective reference voltage based on the reference voltage signal,
the reference signal processor comprises the following being connected successively: a positive-phase amplifier, a band-pass filter, and an effective value calculator, and
the reference signal processor is connected to the processing controller through the first analog-digital converter.

20. The clamp meter according to claim 19, wherein the clamp meter further comprises a time-sharing controller used for controlling output of the induced signal processor and the reference signal processor to be inputted to the processing controller respectively through the first analog-digital converter at different times.

21. A clamp meter, used for detecting resistance of a ground loop on which detection is to be performed, the clamp meter comprising:
a source transformer, wherein the source transformer comprises a toroidal core and a first coil winding set wound around the toroidal core of the source transformer, and wherein the source transformer is configured to receive an alternating input voltage signal and is electrically coupleable to the ground loop on which detection is to be performed;
an induction transformer, wherein the induction transformer comprises a toroidal core and a second coil winding set wound around the toroidal core of the induction transformer, and wherein the induction transformer is electrically coupleable to the ground loop on which detection is to be performed and the induction transformer is configured to generate an induced current signal as a response to the input voltage signal;
a reference resistance loop, wherein the reference resistance loop is electrically coupled to the source transformer and the induction transformer; and
a processing controller, wherein the processing controller receives the induced current signal and the processing controller is configured to determine the resistance of the ground loop based on the induced current signal, wherein the toroidal core of the source transformer and the toroidal core of the induction transformer each comprises a first clamp and a second clamp capable of opening and closing relative to each other, wherein when the first clamp closes relative to the second clamp, a closed region is formed between the first clamp and the second clamp, and when the first clamp opens relative to the second clamp, an opening is formed between the first clamp and the second clamp through which a segment of the ground loop on which the detection is to be performed can pass into the closed region between the first clamp and the second clamp, wherein the reference resistance loop comprises a wire and a resistive element connected to each other in series, and the wire passes through the closed region formed by the first clamp and the second clamp of the toroidal core of the source transformer and passes through the closed region formed by the first clamp and the second clamp of the toroidal core of the induction transformer, wherein the clamp meter further comprises a reference signal processor connected to a resistive element of the reference resistance loop, and the reference signal processor receives a reference voltage signal generated by the reference resistance loop as a response to the input voltage signal and generates an effective reference voltage based on the reference voltage signal, and wherein the processing controller further comprises a memory and the memory stores a preset standard voltage value, and the processing controller is configured to compare a value of the effective reference voltage with the preset standard voltage value, and determine that the first clamp and the second clamp of the toroidal core of the source transformer and the first clamp and the second clamp of the toroidal core of the induction transformer are not closed properly when a difference between the preset standard voltage value and the value of the effective reference voltage is greater than a predetermined threshold.

* * * * *